United States Patent [19]

Collier

[11] Patent Number: 4,879,267

[45] Date of Patent: Nov. 7, 1989

[54] METHOD FOR COLOR AND BLACK AND WHITE REPRODUCTION AND FORMULATION USED THEREWITH

[75] Inventor: Charles P. Collier, Santa Barbara, Calif.

[73] Assignee: Fluorographic Services, Inc., Santa Barbara, Calif.

[21] Appl. No.: 132,401

[22] Filed: Dec. 14, 1987

[51] Int. Cl.⁴ .............................................. B41M 5/16
[52] U.S. Cl. .................................... 503/201; 427/152; 430/293; 503/205; 503/206
[58] Field of Search ................................ 427/150–152; 503/201, 205, 206

[56] References Cited

U.S. PATENT DOCUMENTS 4,477,593 10/1984 Tomlinson .......................... 503/205

Primary Examiner—Bruce H. Hess
Attorney, Agent, or Firm—Lyon & Lyon

[57] ABSTRACT

A more efficient and versatile method for color and halftone reproduction of artwork utilizing a colorless formulation that can be incorporated into art materials. When a mildly acidic spray is applied to the artwork which contains the formulation, the formulation turns blue. The blue color allows reproduction of red and yellow in certain photographic systems and can also be used in halftone reproduction to preserve light colors during the exposure step to eliminate dots from the background areas.

16 Claims, 1 Drawing Sheet

METHOD FOR COLOR AND BLACK AND WHITE REPRODUCTION AND FORMULATION USED THEREWITH

BACKGROUND

Color reproduction is known in the art. When color artwork is prepared for subsequent printing, it is separated manually or photographically into red, yellow, and blue components and photographically broken up into tiny dots of varying sizes depending on the intensity of the red, yellow, or blue in the original. Such photographic reproductions are termed halftones. Printing plates are then prepared with these halftones, and the reproduction is printed with red, yellow, and blue ink corresponding to the red, yellow, and blue components of the original art.

Also known in the art of halftone photography is that the halftone reproductions should have dot free areas corresponding to the non-colored areas of the original art, whether red free, yellow free, or blue free, or any combination thereof. To obtain those dot free areas, while still holding dots in the lightest tones of the colored areas is quite difficult, and often requires, among other techniques; hand masking, the use of special optical filters, or double exposing (one exposure with, and one without the halftone screen).

Further, photographic halftone reproduction of colored art copy containing red and yellow colors and combinations thereof has not been possible heretofore by a Helium Neon Laser Camera because the camera is capable of photographically reproducing onto photographic film or paper only gray and blue color tones. This obviously limits the use of this camera, because it is incapable of transferring all colors to film.

SUMMARY OF THE INVENTION

This invention relates to a method of color reproduction and, more particularly, to a method of preparing and using colored art copy for obtaining printed reproduction thereof, in full color, without the necessity of making the usual photographic color separations through colored light filters. It also relates to the materials used for this method.

The invention further relates to an improved method for preparing and using continuous tone black-and-white art copy for subsequent highlight halftone reproduction and printing.

One of the objectives of this invention is the photographic halftone reproduction of colored art copy containing red and yellow colors or combinations thereof by a Helium Neon Laser Camera capable, heretofore, of only photographically reproducing onto photographic film or paper, grays and blues, and colors containing tones of grays and blues. Said film or paper is photographically sensitive in the yellow and red regions of the color spectrum.

Another object of this invention is to more easily and efficiently reproduce photographic halftones of colored art copy onto photographic orthochromatic film or paper. The invention allows a conventional process camera to be used without color correcting filters, requiring only a single exposure for each color through a halftone screen and also facilitates the elimination of the halftone pattern from uncolored highlight and/or background areas.

It is another object of this invention to more easily and efficiently photographically prepare highlighted halftone reproductions of gray continuous toned art copy, such as wash drawing, marker renderings, and pencil art. Said highlighted halftone reproduction eliminates the halftone screen pattern from the white highlight and/or background area of the art with a single exposure through a halftone screen, i.e., an additional exposure with the halftone screen removed is not required.

A coloring agent in all art materials, used to prepare the original color or black and white art, enables the objectives of this invention to be achieved. The coloring agent is in a colorless state when incorporated in the art materials. This allows the artist to prepare the art using the true colors or grays, in the same hue and depths of tones he desires in the printed reproductions.

The concentration of the colorized coloring agent in the colored or gray medium is in proportion to the concentration of the visible color or gray. Further, the colorized coloring agent is capable of being photographically reproduced by the aforementioned Helium Neon Laser Camera. It can also extend the depth and strength of tones for reproduction using orthochromatic film or paper so that the lightest tones of color or gray are deepened by the coloring agent to a depth where an increase in halftone camera exposure will eliminate those halftone dots in the uncolored areas, while adjusting the size of the halftone dots in the lightest tones of color or gray to reproduce the original color on the printed page.

DESCRIPTION OF THE PREFERRED EMBODIMENT

Figure 1:
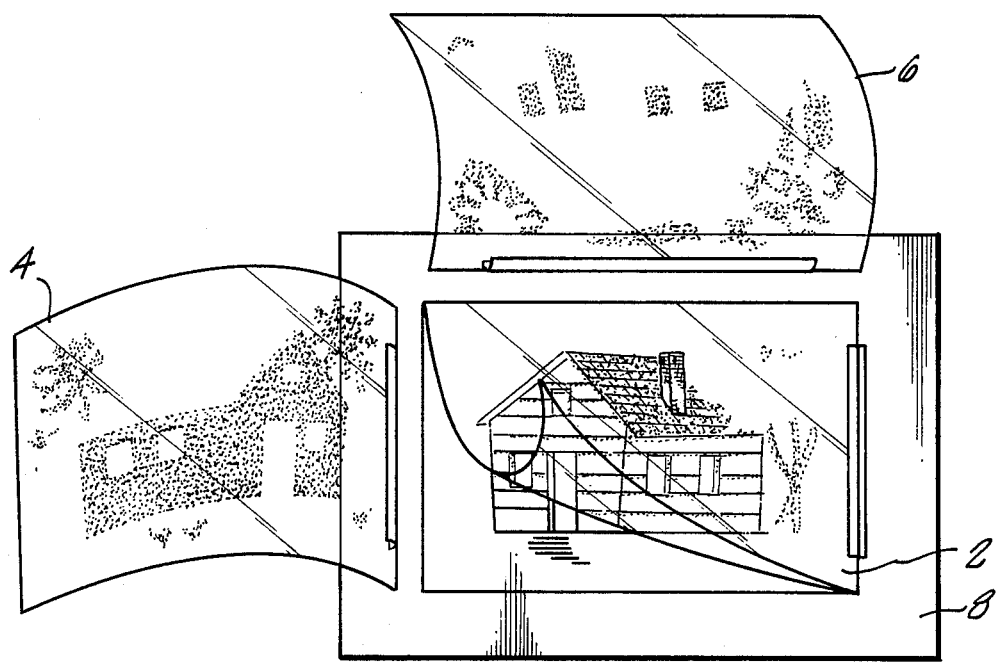
FIG. 1 shows a white illustration board with three overlays which cover the drawing.

The invention is straight forward in its application. Art materials, such as transparent or translucent red, yellow and blue color paints, containing the colorless blue dye, CI Leuco Acid Blue 22, are applied in desired tones by brush, or marker, each color to a separate transparent or translucent film overlaying a key black and white drawing as pictured in FIG. 1. By using the primary colors of red, yellow and blue in desired depth of tone, the overall result of the finished drawing, by viewing through the three overlays 2, 4 and 6 to the black and white key drawing 8, which acts as a base for the overlays, is a full color rendering of primary and secondary colors. After each overlay is finished, and the paint dried, it can then be sprayed with an acidifying spray to colorize the colorless blue dye. The acidifying spray does not substantially effect the visible color dye or pigment nor the resin or binder that adheres the color to the transparent or translucent film, nor the film itself. It does render the colorless blue dye to its full blue color, and each film overlay can then be individually reproduced, photographically, with a Helium Neon Laser Camera or conventional process camera, by a single halftone exposure with a white paper under the overlay.

Intermediate tones of red, yellow and blue can be obtained by preparing a deep and pale tone of each primary color, and mixing the respective deep and pale colors which results in the desired intermediate tones. The concentration of the colorless blue dye is adjusted for deep and pale colors to photographically reproduce, on acidifying, the deepest and lightest tones for printing. The acidified mixtures of the deep and pale colors on the overlays will, of course, reproduce the intermediate tones.

The amount of colorless blue dye added to the pale red, yellow and blue artists' colors, and applied to the transparent or translucent film overlays, then dried and subsequently sprayed with the acidifying spray, adds to these pale colors a sufficiently deep blue hue; on photographic halftone reproduction using either a Helium Neon Laser Camera or a conventional process camera with orthochromatic film or paper, the printable halftone screen pattern is held while the halftone screen pattern in the white background is eliminated.

The concentration of the colorless blue dye in the deep red, yellow and blue colors is such that, after drying and acidifying, the colors have a sufficiently deep blue color to photographically reproduce as a very deep or dark halftone pattern. The concentration of the colorless blue dye in the pale and deep colors is further adjusted so that the camera exposures for each overlay can be accomplished without the use of color contrasting filters.

The colorless blue dye can also be incorporated into art materials such as gray watercolor and opaque paints; pencil lead, and gray markers which can be used on art board, paper, film, etc. The concentration is such that the colorless blue dye, even in the lightest gray is sufficiently blue when colorized to hold a light printable halftone screen pattern while the screen pattern in the white background is eliminated. The colorless blue dye in the deepest gray, when the dye is colorized reproduces as a very deep or dark halftone pattern. This results in a full range of gray tones in the halftones reproduction which corresponds to the range of grays the artist has applied containing the blue dye in its colorless state. This highlighted halftone requires only one exposure step, the exposure through the halftone screen. Previously, such highlighting, or removing halftone pattern from the white background, required at least two exposure steps, or a masking step.

An alkalizing agent can be applied to the blue dye, CI Leuco Acid Blue 22 in this embodiment, to return it to its colorless state, thereby allowing the artwork to be returned to its original color.

The following are sample formulations and are for purposes of illustration only and not intended to limit the invention except in the spirit of the appended claims. The concentration of dyes, pigments, resins, acids and bases given can be varied for an increase or decrease in depth of color; speed and efficiency of colorizing and decolorizing the blue dye; reproducability to the various film surfaces; or protection of the blue dye against bleeding. Also, an obvious modification to one skilled in the art would be to incorporate the CI Leuco Acid Blue 22 concentrate into any art material used in artwork that is to be photographically reproduced.

EXAMPLE

The following is a sample formulation for the Leuco Acid Blue concentrate - CI Acid Blue 22.

| CONCENTRATE FORMULATION | | |
|---|---|---|
| Ingredient | Quantity | Function |
| Water | 200 ml | Solvent |
| C.I. Acid Blue 22 | 30 grams | Dye |
| Sodium Sulfite | 15 grams | Decolorizing Agent |

| CONCENTRATE FORMULATION -continued | | |
|---|---|---|
| Ingredient | Quantity | Function |
| Morpholine | 5 ml | Decolorizing Agent |

The dye is first dissolved in water, then the sulfite is dissolved in the solution. The morpholine is added last.

The following is a sample formulation for a color base to which pigments can be added in order to make the various colored art materials used in making the artwork.

| COLOR BASE FORMULATION | | |
|---|---|---|
| Ingredient | Quantity | Function |
| Water | 55 ml | Solvent |
| Tetrasodium Pyrophosphate | 5 grams | Suspending Agent For Pigment |
| Aqueous Acrylic Polymer Emulsion | 45 ml | Film Former |

The phosphate is first dissolved in water and the emulsion is then added to the solution. A suitable aqueous acrylic polymer emulsion is Rhoplex® AC234. Rhoplex is a registered trademark of the Rohm and Haas Company. Another suitable ingredient is a cross-linking vinyl acetate copolymer such as X-Link 2813 which is manufactured by the National Starch and Chemical Corporation.

The following formulations are for deep colors:

| DEEP COLORS FORMULATION | | |
|---|---|---|
| Ingredient | | Quantity |
| Deep Red: | | |
| | Concentrate | 20 ml |
| | Color Base | 80 ml |
| | C.I. Pigment Red 169 | 2.5 g |
| | C.I. Pigment Red 210 | 3.5 g |
| Deep Blue: | | |
| | Concentrate | 20 ml |
| | Color Base | 80 ml |
| | C.I. Pigment Blue 15 | 8 g |
| Deep Yellow: | | |
| | Concentrate | 20 ml |
| | Color Base | 80 ml |
| | C.I. Pigment Yellow 83 | 5 g |

One way to achieve pale colors is to add more concentrate and color base to the deep color formulations previously discussed. This is done in the following proportions:

| PALE COLOR FORMULATIONS | | |
|---|---|---|
| | Ingredient | Quantity |
| Pale Red: | Concentrate | 2 ml |
| | Color Base | 100 ml |
| | Deep Red Color | 6 ml |
| Pale Blue: | Concentrate | 2 ml |
| | Color Base | 100 ml |
| | Deep Blue Color | 4 ml |
| Pale Yellow: | Concentrate | 2 ml |
| | Color Base | 100 ml |
| | Deep Yellow Color | 4 ml |
| | C.I. Pigment Yellow 83 | .25 g |

Intermediate colors can be obtained by mixing the deep and pale colors discussed above in the proportions necessary to achieve the desired color.

C.I. Acid Blue 93 can be substituted for C.I. Acid Blue 22 in making the concentrate used in the above formulations. The proportion of the Acid Blue to the other ingredients does not change when the C.I. Acid Blue 93 is used. A formulation of the Leuco Acid Blue Concentration using the C.I. Acid Blue 93 is as follows:

| ALTERNATE CONCENTRATE FORMULATION | |
| --- | --- |
| Ingredients | Quantity |
| Water | 200 ml |
| C.I. Acid Blue 93 | 30 g |
| Sodium Sulfite | 5 g |
| Morpholine | 2 ml |

For different tones of gray, or pigmented water colors for black and white wash drawings on art board, the following formulations can be used:

| | Ingredients | Quantity |
| --- | --- | --- |
| Deep Gray: | Water | 300 ml |
| | Black Drawing Ink | 150 ml |
| | Concentrate | 20 ml |
| Medium Gray: | Water | 300 ml |
| | Black Drawing Ink | 30 ml |
| | Concentrate | 10 ml |
| Pale Gray: | Water | 300 ml |
| | Black Drawing Ink | 1 ml |
| | Concentrate | 2 ml |

An obvious modification would be to mix the above formulations in sufficient quantities to achieve any desired intermediate tone.

For the mildly acidic spray that causes the concentrate to change from its colorless state to a blue color, the following formulation can be used:

| Ingredient | Quantity | Function |
| --- | --- | --- |
| Isopropyl Alcohol | 95 ml | Inert Solvent |
| Water | 2.5 ml | Diluent for acid |
| Hydrochloric Acid (31.4% Solution) | 2.5 ml | Acid Colorizing Agent for Concentrate |

If it is necessary or desired to have the concentrate return to its decolorized state, such as after the artwork has been reproduced the following basic formulation can be used:

| Ingredient | Quantity | Function |
| --- | --- | --- |
| Isopropyl Alcohol | 95 ml | Insert Solvent |
| Water | 2.5 ml | Diluent for Base |
| Morpholine | 2.5 ml | Basic Decolorizing Agent for Concentrate |

It would be an obvious modification to one skilled in the art to use the principles disclosed herein in any art materials that might be used in artwork that is desired to be photographically reproduced. Examples of other art materials into which the Leuco Acid Blue might be incorporated are gray markers, pencils and tempera paints. The formulations discussed above would have to be modified in order to work acceptably with these different materials. The examples discussed herein are for purposes of illustration only and are not intended to limit the invention except in the spirit of the appended claims.

What is claimed is:

1. A method of photographic color reproduction of artwork comprising:
   adding a solution comprising a colorless coloring agent to colored art materials;
   preparing a drawing using said colored art materials with the colorless coloring agent incorporated therein;
   spraying the artwork with an acidic spray which causes the colorless coloring agent to become colored;
   photographically reproducing the drawing; and
   restoring the artwork to its original color by applying an alkaline solution to the artwork.

2. The method of claim 1 wherein the colorless coloring agent is a colorless blue dye.

3. The method of claim 2 wherein the colorless blue dye is CI Leuco Acid Blue 22.

4. The method of claim 2 wherein the colorless blue dye is Leuco Acid Blue 93.

5. The method of claim 1, 2, 3 or 4 wherein the solution further comprises a solvent and a decolorizing agent.

6. The method of claim 1 wherein the art materials are comprised of pigment and a color base further comprising a solvent, a suspending agent for pigment and film former.

7. The method of claim 6 wherein the solution is incorporated into the art materials in a ratio of approximately one part of solution for four parts of color base if a deep color is sought to be reproduced to approximately three parts of solution for one hundred parts of color base if a pale color is sought to be reproduced.

8. The method of claim 1 wherein the artwork is photographically reproduced using a conventional process camera.

9. The method of claim 1 wherein the artwork is photographically reproduced using a Helium Neon Laser Camera.

10. The method of claims 1, 8 or 9 in which the artwork is reproduced onto orthochromatic film.

11. The method of claims 1, 8 or 9 in which the artwork reproduced on diffusion transfer paper.

12. The method of claim 1 wherein the drawing is prepared by the method comprising:
    making a black key drawing on white illustration board, allowing sufficient margins on the sides for fastening an overlay thereto;
    making an individual overlay for each primary color that will be reproduced; and
    fastening the overlays to the white illustration board, the color overlays making a full color drawing when placed on top of the white illustration board.

13. The method of claim 12 wherein the artwork is photographically reproduced using a halftone screen using one exposure for each overlay.

14. The method of claim 12 wherein each film overlay is reproduced by a single halftone exposure with white paper under the overlay.

15. The method of claim 14 which requires only one exposure step to photographically reproduce the artwork.

16. The method of claim 1 wherein the solution containing the colorless dye is added to a light gray art material, the light gray art material registering a halftone pattern when photographically reproduced so that halftone dots can be removed from the background without removing the light gray tones.

* * * * *